United States Patent
Mullin

(10) Patent No.: US 9,331,501 B2
(45) Date of Patent: May 3, 2016

(54) MULTI-CELL THIN FILM MICROBATTERY ARRAY

(75) Inventor: Jeffrey D. Mullin, Elk River, MN (US)

(73) Assignee: CYMBET CORPORATION, Elk River, MN (US)

( * ) Notice: Subject to any disclaimer, the term of this patent is extended or adjusted under 35 U.S.C. 154(b) by 870 days.

(21) Appl. No.: 13/587,469

(22) Filed: Aug. 16, 2012

(65) Prior Publication Data

US 2013/0043731 A1 Feb. 21, 2013

Related U.S. Application Data

(60) Provisional application No. 61/524,653, filed on Aug. 17, 2011.

(51) Int. Cl.
  *H01M 10/48* (2006.01)
  *H01M 6/42* (2006.01)
  *H02J 7/00* (2006.01)
  *G01R 31/36* (2006.01)
  (Continued)

(52) U.S. Cl.
  CPC ......... *H02J 7/0021* (2013.01); *H01M 10/0445* (2013.01); *G01R 31/362* (2013.01); *G01R 31/3658* (2013.01); *H01M 10/0436* (2013.01); *H01M 10/052* (2013.01); *H02J 7/0026* (2013.01); *Y10T 307/696* (2015.04)

(58) Field of Classification Search
  USPC ...................................... 429/91, 92, 158, 159
  IPC ....................................................... H01M 10/48
  See application file for complete search history.

(56) References Cited

U.S. PATENT DOCUMENTS

| 5,312,152 A | 5/1994 | Woebkenberg, Jr. et al. |
| 5,314,765 A | 5/1994 | Bates |
| 5,338,625 A | 8/1994 | Bates |

(Continued)

FOREIGN PATENT DOCUMENTS

| JP | 2008278668 | 11/2008 |
| WO | 2006-060391 | 6/2006 |

OTHER PUBLICATIONS

Intersil Application Note, Designing Multi-Cell Li-ion Battery Packs Using the USL9208 Analog Front End, AN1333.0, Jul. 17, 2007, 25 pgs.

(Continued)

*Primary Examiner* — Patrick Ryan
*Assistant Examiner* — Julian Anthony
(74) *Attorney, Agent, or Firm* — Kagan Binder, PLLC

(57) ABSTRACT

A rechargeable thin film microbattery cell array of at least four thin film microbattery cells is electrically connected together in parallel to provide power as a single battery power source. The array further comprises testing logic to determine if a microbattery cell has a microbattery cell voltage that is more than a predetermined percentage different from the voltage of the overall microbattery cell array or has an absolute voltage below a predetermined cutoff threshold, and logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold. Embodiments also comprise a Switch Capacitor DC-DC downconverter component that reduces the voltage potential to operate some or all functionalities located on the integrated circuit.

18 Claims, 7 Drawing Sheets

(51) Int. Cl.
*H01M 10/04* (2006.01)
*H01M 10/052* (2010.01)

(56) References Cited

U.S. PATENT DOCUMENTS

| | | |
|---|---|---|
| 5,445,906 A | 8/1995 | Hobson et al. |
| 5,512,147 A | 4/1996 | Bates et al. |
| 5,561,004 A | 10/1996 | Bates et al. |
| 5,567,210 A | 10/1996 | Bates et al. |
| 5,569,520 A | 10/1996 | Bates |
| 5,597,660 A | 1/1997 | Bates et al. |
| 5,612,152 A | 3/1997 | Bates |
| 5,654,084 A | 8/1997 | Egert |
| 5,705,293 A | 1/1998 | Hobson |
| 5,952,815 A | 9/1999 | Rouillard et al. |
| 6,046,514 A | 4/2000 | Rouillard et al. |
| 6,517,968 B2 | 2/2003 | Johnson et al. |
| 6,641,942 B1 | 11/2003 | Rouillard et al. |
| 6,906,436 B2 | 6/2005 | Jenson et al. |
| 6,986,965 B2 | 1/2006 | Jenson et al. |
| 7,299,377 B2 | 11/2007 | Norman |
| 7,776,478 B2 | 8/2010 | Klaassen |
| 7,931,989 B2 | 4/2011 | Klaassen |
| 7,939,205 B2 | 5/2011 | Klaassen |
| 8,228,023 B2 | 7/2012 | Sather et al. |
| 2005/0147877 A1 | 7/2005 | Tarnowski et al. |
| 2007/0012244 A1 | 1/2007 | Klaassen |
| 2008/0203972 A1 | 8/2008 | Sather et al. |
| 2009/0010462 A1 | 1/2009 | Ekchian et al. |
| 2009/0051320 A1* | 2/2009 | Muntermann ............... 320/116 |
| 2009/0214899 A1 | 8/2009 | Shakespeare et al. |
| 2010/0225278 A1 | 9/2010 | Reefman et al. |
| 2010/0261049 A1 | 10/2010 | Kwak et al. |
| 2011/0183183 A1 | 7/2011 | Grady et al. |

OTHER PUBLICATIONS

Intersil Data Sheet, ISL9216, ISL9217, FN6488.1, Nov. 2, 2007, 33 pgs.

PCT International Search Report and Written Opinion, mailed Jan. 31, 2013.

PCT International Preliminary Report on Patentability, PCT/US2012/051162, mailed Feb. 27, 2014.

* cited by examiner

MULTI-CELL THIN FILM MICROBATTERY ARRAY

CROSS-REFERENCE TO RELATED APPLICATIONS

This application claims the benefit of U.S. Provisional Application Ser. No. 61/524,653, filed Aug. 17, 2011, entitled "MULTI-CELL THIN FILM MICROBATTERY ARRAY" which application is incorporated herein by reference in its entirety.

FIELD OF THE INVENTION

This invention relates to the field of thin-film solid-state energy-storage devices, and more specifically to configurations of thin-film solid-state batteries.

BACKGROUND OF THE INVENTION

Electronics have been incorporated into many portable devices such as computers, mobile phones, tracking systems, scanners, etc. One drawback to portable devices is the need to include the power supply with the device. Portable devices typically use batteries as power supplies. Batteries must have sufficient capacity to power the device for at least the length of time the device is in use. Sufficient battery capacity can result in a power supply that is quite heavy and/or large compared to the rest of the device. Accordingly, smaller and lighter batteries (i.e., power supplies) with sufficient energy storage are desired. Other energy storage devices, such as supercapacitors, and energy conversion devices, such as photovoltaics and fuel cells, are alternatives to batteries for use as power supplies in portable electronics and non-portable electrical applications.

One type of an energy-storage device is a solid-state, thin-film microbattery. Examples of thin-film batteries are described in U.S. Pat. Nos. 5,314,765; 5,338,625; 5,445,906; 5,512,147; 5,561,004; 5,567,210; 5,569,520; 5,597,660; 5,612,152; 5,654,084; and 5,705,293. U.S. Pat. No. 5,338,625 describes a thin-film battery, especially a thin-film microbattery, and a method for making same having application as a backup or first integrated power source for electronic devices. U.S. Pat. No. 5,445,906 describes a method and system for manufacturing a thin-film battery structure formed with the method that utilizes a plurality of deposition stations at which thin battery component films are built up in sequence upon a web-like substrate as the substrate is automatically moved through the stations.

US Patent Application Publication No. 2005/0147877 describes a thin-film battery such as one that includes lithium or lithium compounds connected to an electronic circuit. An environmental barrier is deposited as alternating layers, at least one of the layers providing a smoothing, planarizing, and/or leveling physical-configuration function, and at least one other layer providing a diffusion-barrier function.

However, due at least in part to the relatively small size, such storage devices may not be able to provide adequate power for an associated electronic device. Of course multiple batteries may be connected in series or parallel, depending on the voltage and current requirements of a device, to increase power output over just a single battery. Such configurations, though, require multiple batteries and space in a small, portable device once again becomes an issue. Accordingly, there continues to be a need for devices and methods that facilitate provision of power supplies in small devices.

SUMMARY OF THE INVENTION

Rechargeable thin film microbatteries are in particular difficult to manufacture on a high yield and high reliability basis. Because of the challenging manufacturing tolerances, weaknesses or faults in thin film microbatteries can be present in the microbattery as initially formed. For example, a discontinuity caused, for example, by fracture or gap in the coating of the electrolyte layer may be generated during the manufacture process. Alternatively, a problem could develop in the microbattery during wiring of the microbattery to a device, during initial charge, during use, or even during testing of the viability of the microbattery or attached devices. In particular, any discontinuities of the electrolyte layer will lead to shorts, and immediate failure of the microbattery. Additionally, failures of the microbattery may be introduced during routine handling and charge/discharge operations, whereby fractures or dendrite formation may occur that also lead to shorts in the microbattery. Over time, it is likely that one or two facture points could be introduced in a given footprint area of microbattery.

As the footprint size of the microbattery increases, it is increasingly difficult to manufacture and manipulate batteries in an acceptable yield of functioning batteries. Thus, it is currently not possible to provide microbatteries having a thickness on the order of 50 microns from the respective interior surfaces of the anode to cathode current collectors and having a footprint of 13 $cm^2$ in an acceptable yield.

Because of the nature of use of thin film batteries, failure of a microbattery has catastrophic effects far beyond the value of the microbattery itself. Conventional batteries such as coin or button batteries can simply be replaced when damaged. Thin film microbatteries, however, are used on very small devices and are usually integrally wired into, for example a circuit board or in integral combination with one or more devices, such as integrated circuits, power sources, antennas or combinations of multiple devices. When the thin film microbattery fails, replacement of the microbattery usually is not a commercially viable option. The entire microbattery and device combination product is rendered useless, representing a loss of far more than the economic value of the microbattery alone.

A rechargeable thin film microbattery array of at least two thin film microbattery cells electrically connected together in parallel to provide power as a single microbattery power source provides a surprising benefit as compared to prior thin film microbatteries. The array as described herein further comprises testing logic to determine if a microbattery cell has a microbattery voltage that is more than a predetermined percentage different from the voltage of the overall microbattery cell array or has an absolute voltage below a predetermined cutoff threshold, and logic to disconnect any microbattery cell from the microbattery cell array if the microbattery cell has a microbattery cell voltage that is more than the predetermined percentage different from the voltage of the overall microbattery cell array or has an absolute voltage below a predetermined cutoff threshold.

In a preferred embodiment, a microbattery cell is disconnected from the microbattery cell array if it has an absolute voltage below a predetermined cutoff threshold of less than about 3 volts.

It has been found that a single failure that would destroy a single microbattery cell will not destroy functionality of the microbattery cell array of the present invention, because the single failure will only affect one cell, leaving a plurality of cells still operational. Disconnecting the thus identified microbattery cell operates to protect the rest of the microbattery cell array from deep discharge. By providing an array having at least two cells, and preferably at least four cells, a level of redundancy in power supply can be provided so that even if there are multiple failures, the overall microbattery cell construction is still capable of producing operational levels of power. Notably, such failures may occur either in manufacturing, product handling, or in use of the microbattery cell array. The present array therefore provides a corrective feature whereby even if there is a cell failure during the manufacture and supply chain, a functional microbattery cell array product may be provided to the customer at nearly 100% yield. This is a very significant advantage in applications where reliability is of paramount importance. Furthermore, the reliability of the present microbattery cell array is extremely high both at the initial time of supply and over long term use.

Testing of microbattery cells is a challenge due to sheer volume of the product, and also because it is typically necessary to charge a microbattery cell to determine if it will properly function. At the same time, quality assurance to establish high yield functionality of microbattery cells is often critical, due to economic loss of an entire combination product of high value due solely to microbattery cell failure. Even worse, product functionality in critical application products, such as in medical or safety applications, could be lost due solely to microbattery cell failure. Thus, while it highly desirable to test each microbattery cell to assure functionality prior to connection with other devices, there are significant risks involved in carrying out such tests relative to the viability of the microbattery cell. For example, in certain microbattery cell configurations, a charged microbattery cell is more vulnerable to damage during processing. For example, certain batteries, such as lithium metal batteries, are vulnerable to damage during heat processing or welding operations.

It has been determined that microbattery cell arrays of the present invention may in some embodiments and applications not require testing prior to connection with other devices, because the likelihood of failure of all cells of the microbattery cell array to the level of inoperability is extremely low. Additionally, rapid predictive test methodology may be sufficient to establish product functionality of the present microbattery cell array in place of full operational testing as is often required in prior art thin film batteries.

Because the present array comprises testing logic, faulty cells are automatically disconnected from the array, thereby assuring that the microbattery cell array will continue to provide adequate power as needed in the event of failure of any cells.

BRIEF DESCRIPTION OF THE DRAWINGS

The accompanying drawings, which are incorporated in and constitute a part of this application, illustrate several aspects of the invention and together with a description of the embodiments serve to explain the principles of the invention. A brief description of the drawings is as follows.

DETAILED DESCRIPTION OF PRESENTLY PREFERRED EMBODIMENTS

Figure 1:
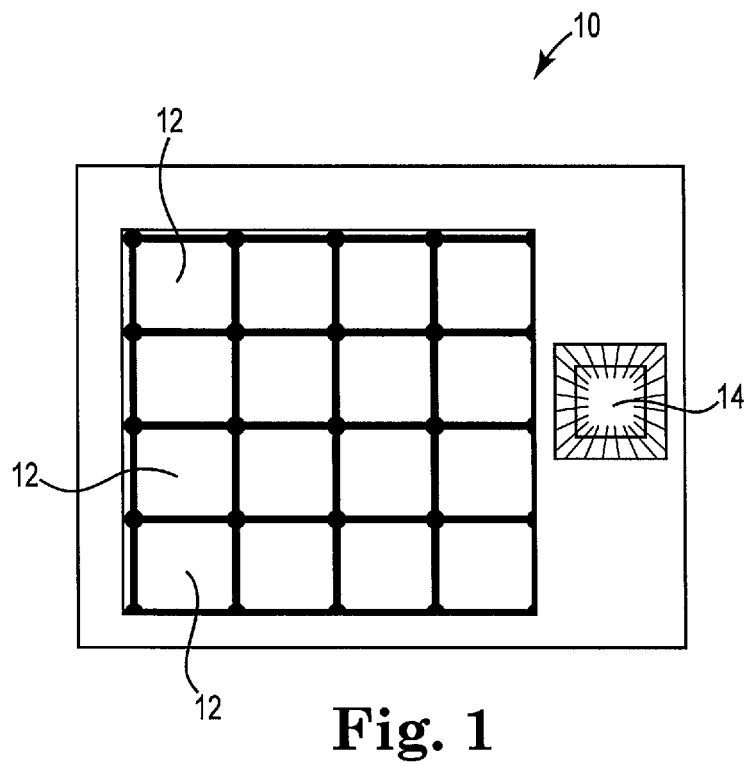
FIG. 1 shows a plan view of an embodiment of the microbattery cell array and microchip containing testing logic of the present invention.

It is to be understood that a device and method in accordance with the present invention includes, but is not limited to, novel combinations of conventional components, and not just particular detailed configurations thereof. Accordingly, the structure, methods functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

For purposes of the present invention, a thin film microbattery cell is a microbattery cell having dimensions not exceeding a longest dimension of 60 mm, more preferably not exceeding 20 mm, and has a thickness measured from the respective interior surfaces of the anode and cathode current collectors not exceeding 50 microns. Additionally, each individual microbattery cell has an effective capacity of no greater than about 100 uAH, more preferably no greater than about 25 uAH. As used herein, the term "microbattery cell" includes microbattery cell assemblies that are functional, and additionally microbattery cells that are not yet functional, but which will be functional upon application of an initial charge. An example of a microbattery cell in a pre-charged state is an assembly of microbattery cell components that does not contain a functional amount of metallic lithium anode, but which, when sufficiently charged, contains a functional metallic lithium anode. Thus, thin film microbatteries of the present invention may be an assembly of components that has never been charged, or that has been partially charged, but not sufficiently charged to contain metallic lithium in an amount sufficient to function as a practical microbattery (i.e. sufficient to power a component such as an ASIC for its intended operational cycle).

The individual microbattery cells of the present invention are small in size, and so the small dimensions of the microbattery cells provide significant advantages in providing an overall microbattery cell array that fit in small devices. Preferred individual microbattery cells are generally in the shape of a square wafer, i.e. having sides in the X and Y direction that provide a generally planar appearance to the microbattery cell, and a thickness in the Z direction that is small to provide an overall microbattery cell array that fits well in size and shape in electronic devices. While generally square shaped microbattery cells are preferred and discussed in this description, other shapes of microbattery cells are also contemplated. For example, the microbattery cells may be rectangular, triangular, pentagonal, circular, or other shape as will now be understood. In an embodiment of the present invention, each microbattery cell in the microbattery cell array has largest side length of from about 2 mm to about 20 mm on each side. In another embodiment, each microbattery cell in the microbattery cell array has a length of from about 2 mm to about 20 mm on each side.

Thin film microbattery cells comprise a cathode current collector, a cathode, an electrolyte, and anode and an anode current collector. The microbattery cell typically is manufactured on a substrate. In a preferred embodiment of the present invention, the thin film microbattery cell is initially constructed without an anode, but with a cathode layer that can act as a source of lithium ions. Upon charging of this thin film microbattery cell embodiment, metallic lithium is plated between the electrolyte and the anode current collector to form an anode. Alternatively, the anode may be formed by intercalation of the anode material in a layer receptive for forming and anode layer. For example, the cathode layer may be a material such as $LiCoO_2$ that can act as a source of lithium ions. Likewise, the thin film microbattery cell may be initially constructed without a cathode layer that is subsequently formed during charging. Examples of thin-film batteries are described in U.S. Pat. Nos. 5,314,765; 5,338,625; 5,445,906; 5,512,147; 5,561,004; 5,567,210; 5,569,520; 5,597,660; 5,612,152; 5,654,084; 5,705,293; 6,906,436; 6,986,965; 7,931,989; 7,776,478; and 7,939,205 and US Publication Nos. 2009/0214899 and 2007/0012244 each of which is herein incorporated by reference for all purposes, particularly with respect to the construction methodologies and materials selection of the microbattery cell components and embodiments of devices comprising thin film batteries.

For purposes of the present invention, a microbattery cell array is a set of at least two, and preferably at least four, of the above discussed thin film microbattery cells electrically connected together in parallel to provide power as a single microbattery power source. In a preferred embodiment, the array is an array of from 4 to 64 microbattery cells. In another preferred embodiment, the array is an array of from 16 to 32 microbattery cells. In another preferred embodiment, the array is an array of from 50 to 256 microbattery cells, or more preferably from 80 to 120 microbattery cells. The number of microbattery cells in the array as described herein has been found to provide an advantageous balance of minimization of loss of microbattery capacity in the event of a fault, on the one hand, with maximization of available capacity per footprint area by minimizing required "land" areas separating microbattery cells in the array.

It has surprisingly been found that by creating a microbattery cell array as described herein, one can provide a very large battery in a very thin form suitable for special applications, such as for use in computing devices and the like. Applications such as portable computing devices where space and weight is at a premium particularly benefit from the present microbattery cell array. Microbattery cell arrays for use in such applications may, for example have a foot print area of from about 12 $cm^2$ to about 1000 $cm^2$. In an embodiment, the microbattery cell arrays for use in such applications may, for example have a foot print area of from about 12 $cm^2$ to about 50 $cm^2$. In an embodiment, somewhat smaller microbattery cell arrays are desirable. In such embodiments, preferably, the microbattery cell array has a footprint area of no more than 50 $cm^2$.

In another preferred embodiment, smaller microbattery cell arrays are desirable. In such embodiments, preferably, the microbattery cell array has a footprint area of no more than about 13 $cm^2$. In other embodiments the microbattery cell array has a footprint area of no more than about 12 $cm^2$, 11 $cm^2$, 10 $cm^2$, 9 $cm^2$, 8 $cm^2$, 7 $cm^2$, 6 $cm^2$, 5 $cm^2$, $cm^2$, 3 $cm^2$, 2 $cm^2$, or 1 $cm^2$. In an embodiment, the microbattery cell array has minimum footprint about 0.025 $cm^2$ and a footprint area of no more than about 13 $cm^2$, 12 $cm^2$, 11 $cm^2$, 10 $cm^2$, 9 $cm^2$, 8 $cm^2$, 7 $cm^2$, 6 $cm^2$, 5 $cm^2$, $cm^2$, 3 $cm^2$, 2 $cm^2$, or 1 $cm^2$.

Preferably, the total microbattery cell array has a total thickness, not including substrate and outer protective layers (i.e. layers not electrically connected to the microbattery cell), not exceeding about 200 microns, more preferably not exceeding 120 microns, yet more preferably not exceeding 100 micron and most preferably not exceeding 50 microns.

Preferably, the microbattery cell array is an all solid-state system.

The microbattery cells of the present invention may optionally be fabricated either simultaneously or sequentially on a single substrate. Preferably, the microbattery cells are fabricated simultaneously. In an embodiment of the present invention, the respective components (such as the cathodes) are first prepared as a unified layer that is subsequently separated into separate cells by a separation process such as etch or laser ablation. In another embodiment of the present invention, the array of microbattery cells is fabricated on a plurality of substrates that are then mounted on a single platform. The configuration wherein the microbattery cells are on a single substrate is particularly advantageous in ease of manufacturing and in size and space efficiency.

In an embodiment, one of the current collectors (i.e. either the cathode current collector or the anode current collector) is a layer in common for all of the thin film microbattery cells in the array. The other current collectors are separate units, so that the batteries of the array are connected in parallel to the testing logic (e.g. provided in an ASIC) to permit disconnection of individual cells from the overall microbattery cell array.

Preferably, the array provides an effective capacity of from about 0.05 mAH to about 1500 mAH. In an embodiment of the present invention, the array provides an effective capacity of from about 200 mAH to about 500 mAH.

Preferably, the microbattery cell array provides greater than three months real time clock life.

FIG. 1 shows a microbattery cell array 10 comprising individual thin film batteries 12 arranged in a 4×4 array. Individual cells 12 are connected individually to ASIC 14 to permit disconnection of individual cells from the overall microbattery cell array. As shown, the array is laid out in a generally square array. Other microbattery cell configurations, including rectangular, triangular, pentagonal, circular, or other shape as will now be understood. Additionally, the array may be arranged in a vertical or stacked configuration of individual microbattery cells, or in a combination of a horizontal and vertical array of microbattery cells. Arrays of stacked batteries are described in US Patent Application Publication No. 2011/0183183 entitled "BATTERY ARRAYS, CONSTRUCTIONS AND METHOD," which is incorporated herein by reference. As noted above, the individual batteries of the array may be in a shape other than square.

Figure 2:
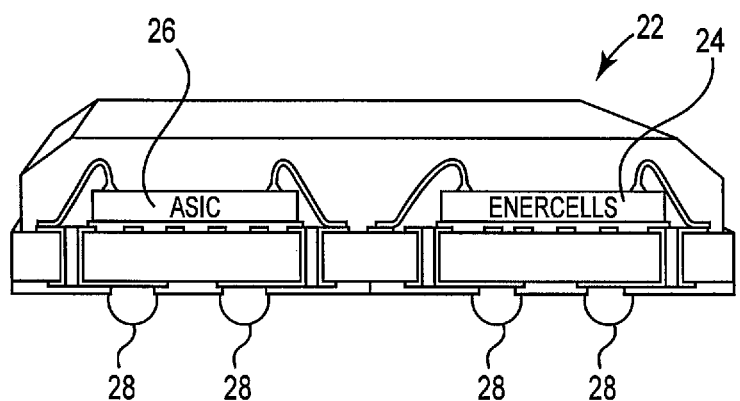
FIG. 2 is an edge view in partial section of an embodiment of the microbattery cell array and microchip containing testing logic of the present invention.

FIG. 2 is an edge view in partial section of an embodiment 22 of the microbattery cell array 24 and ASIC 26 containing testing logic of the present invention. Microbattery cell array 24 and ASIC 26 are wired for separate testing, prior to connection by solder bumps 28 for connection to each other and to a device to which power is to be supplied.

It will be understood that the microbattery cells may be electrically connected to each other and/or to the ASIC or other circuitry using electrical connection techniques other than wirebond. For example the microbattery cells and/or the ASIC or other circuitry may be electrically connected using "flip chip" processes, including solder bump techniques. Other such connection techniques, such as the use of conductive adhesives, are contemplated for all embodiments of the present invention.

Figure 3:
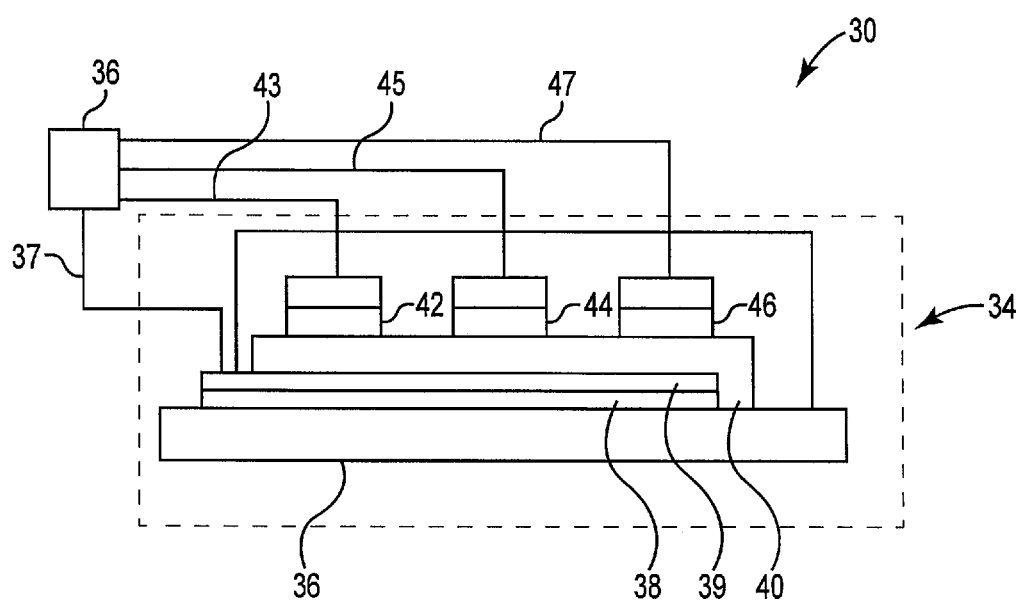
FIG. 3 is a representation of an embodiment of the microbattery cell array and microchip containing testing logic of the present invention.

FIG. 3 is a representation of an embodiment of the microbattery cell array 34 and ASIC 36 containing testing logic of the present invention. Microbattery cell array 34 comprises substrate 36 having anode current collector 38 superjacent thereto, with anode 39 being superjacent to anode current collector 38. Anode 39 is electrically connected to ASIC 36 by lead 37. Electrolyte layer 40 is provided to separate anode 39 from cathodes 42, 44 and 46. Cathode current collectors 43, 45 and 47 electrically connect cathodes 42, 44 and 46, respectively, to ASIC 36 in parallel to permit disconnection of individual cells from the overall microbattery cell array. Optionally, the microbattery cell may be prepared in an "upside down" configuration relative to the construction as described above, i.e. the cathode and cathode current collector materials are switched with the anode and anode current collector.

Additionally, microbattery cell array 10 may include charging circuitry (not shown) as described in co-pending U.S. Pat. No. 8,228,023, which is incorporated by reference herein in its entirety.

Figure 4:
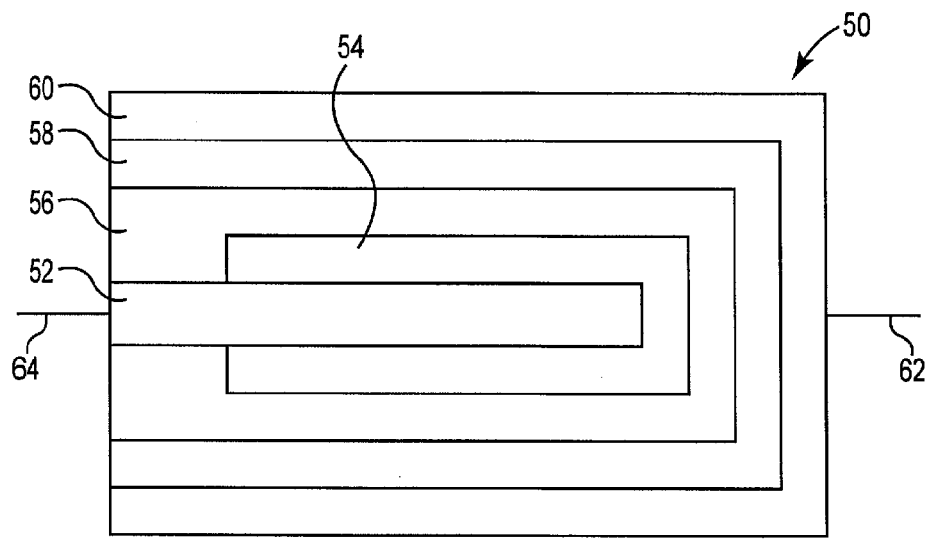
FIG. 4 is a cross-section view of a microbattery cell constructed in a dual layer configuration without a substrate layer.

FIG. 4 is a cross-section view of a microbattery cell 50 constructed in a dual layer configuration without a substrate layer. Cathode current collector 52 is provided with cathode 54 wrapping around both major surfaces and one edge of cathode current collector 52. Electrolyte 56 envelops cathode current collector 52 and cathode 54, and provides a separation from anode 58. Anode current collector 60 is adjacent to anode 58, and is electrically connected to ASIC (not shown) by lead 62. Likewise, cathode current collector 52 is electrically connected to ASIC (not shown) by lead 64. This configuration provides a microbattery cell having increased amount of electrical materials relative to overall material content, because the microbattery cell does not comprise a substrate layer. Optionally, the microbattery cell may be prepared in an "upside down" configuration relative to the construction as described above, i.e. the cathode and cathode current collector materials are switched with the anode and anode current collector.

Figure 5:
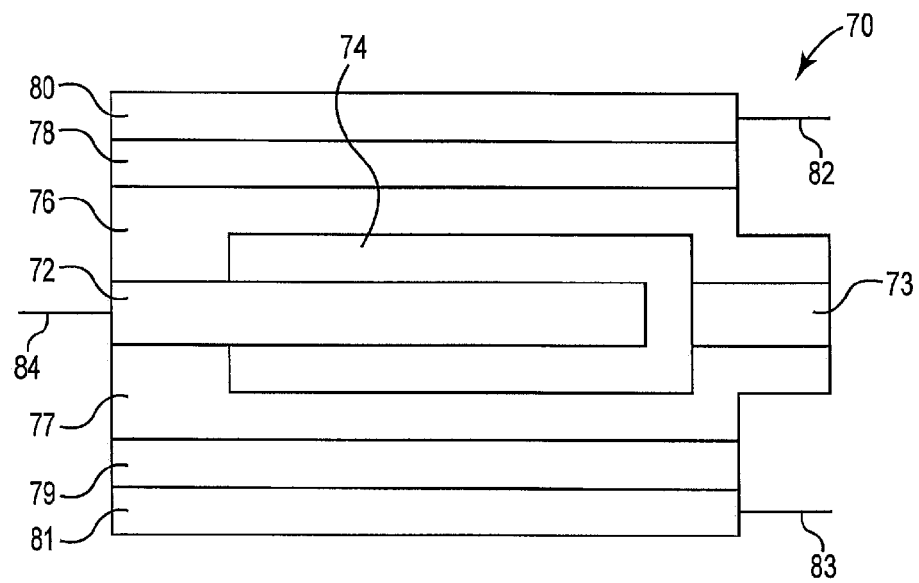
FIG. 5 is a cross-section view of a two microbattery cells constructed in a dual layer configuration without a substrate layer.

FIG. 5 is a cross-section view of a two microbattery cell set 70 constructed in a dual layer configuration without a substrate layer. Cathode current collector 72 is provided with cathode 74 wrapping around both major surfaces and one edge of cathode current collector 72. Electrolyte 76 is superjacent to cathode current collector 72 and cathode 74, and provides a separation from anode 78. Anode current collector 80 is adjacent to anode 78, and is electrically connected to ASIC (not shown) by lead 82. Likewise, electrolyte 77 is superjacent to cathode current collector 72 and cathode 74, and provides a separation from anode 79. Anode current collector 81 is adjacent to anode 79, and is electrically connected to ASIC (not shown) by lead 83. Electrolyte 76 and electrolyte 77 are separated from each other by non-conductive layer 73. Cathode current collector 72 is electrically connected to ASIC (not shown) by lead 84. This configuration provides a microbattery cell having increased amount of electrical materials relative to overall material content, because the microbattery cell does not comprise a substrate layer. This configuration provides two separate microbattery cells that are connected in parallel to the ASIC. Optionally, the microbattery cell may be prepared in an "upside down" configuration relative to the construction as described above, i.e. the cathode and cathode current collector materials are switched with the anode and anode current collector.

As described above, the rechargeable thin film microbattery cell array comprises testing logic to determine if a microbattery cell has a microbattery cell voltage that is more than a predetermined percentage different from the voltage of the overall microbattery cell array, or has an absolute voltage below a predetermined cutoff threshold and logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold. Voltage of the microbattery cell may be measured using conventional voltage measurement techniques as will now be apparent to the skilled person in the art, such as by use of A/D converters or, as shown in the Figures below, a D to A converter in conjunction with a comparator, or other appropriate systems. The predetermined percentage difference appropriate for the microbattery cell array is established based on the overall characteristics of the system (such as the identity of materials from which the microbattery cell is made) and expected conditions of use of the microbattery cell array, to determine whether any individual microbattery cell has failed to an extent that disconnection is necessary to preserve adequate performance of the microbattery cell array as a whole. Performance characteristics of any given microbattery cell additionally may be dependent on ambient conditions of use, such as temperature. The defined voltage percentage difference thus preferably is defined in terms of a reference temperature and pressure or other condition relevant to the use environment of the microbattery cell array. In an embodiment, the predetermined percentage is 10% or 5% at 25° C. In a preferred embodiment, the predetermined percentage is 2% at 25° C. In a preferred embodiment, the predetermined percentage is 1% at 25° C.

In embodiments of the present invention, a greater variation of measured microbattery cell voltage of a microbattery cell from the voltage of the overall microbattery cell array will be permitted when the array is intended to be used at colder temperatures. Again as noted above, one aspect of the test includes logic to determine if a microbattery cell has a microbattery cell voltage that is more than a predetermined percentage different from the voltage of the overall microbattery cell array. For embodiments of the present invention, the predetermined percentage is 10% or 5% at 0° C. Similarly, in embodiments of the present invention, less variation of measured microbattery cell voltage of a microbattery cell from the voltage of the overall microbattery cell array will be permitted when the array is intended to be used at warmer temperatures. Thus, for embodiments of the present invention, the predetermined percentage is 1% at 40° C.

Figure 6:
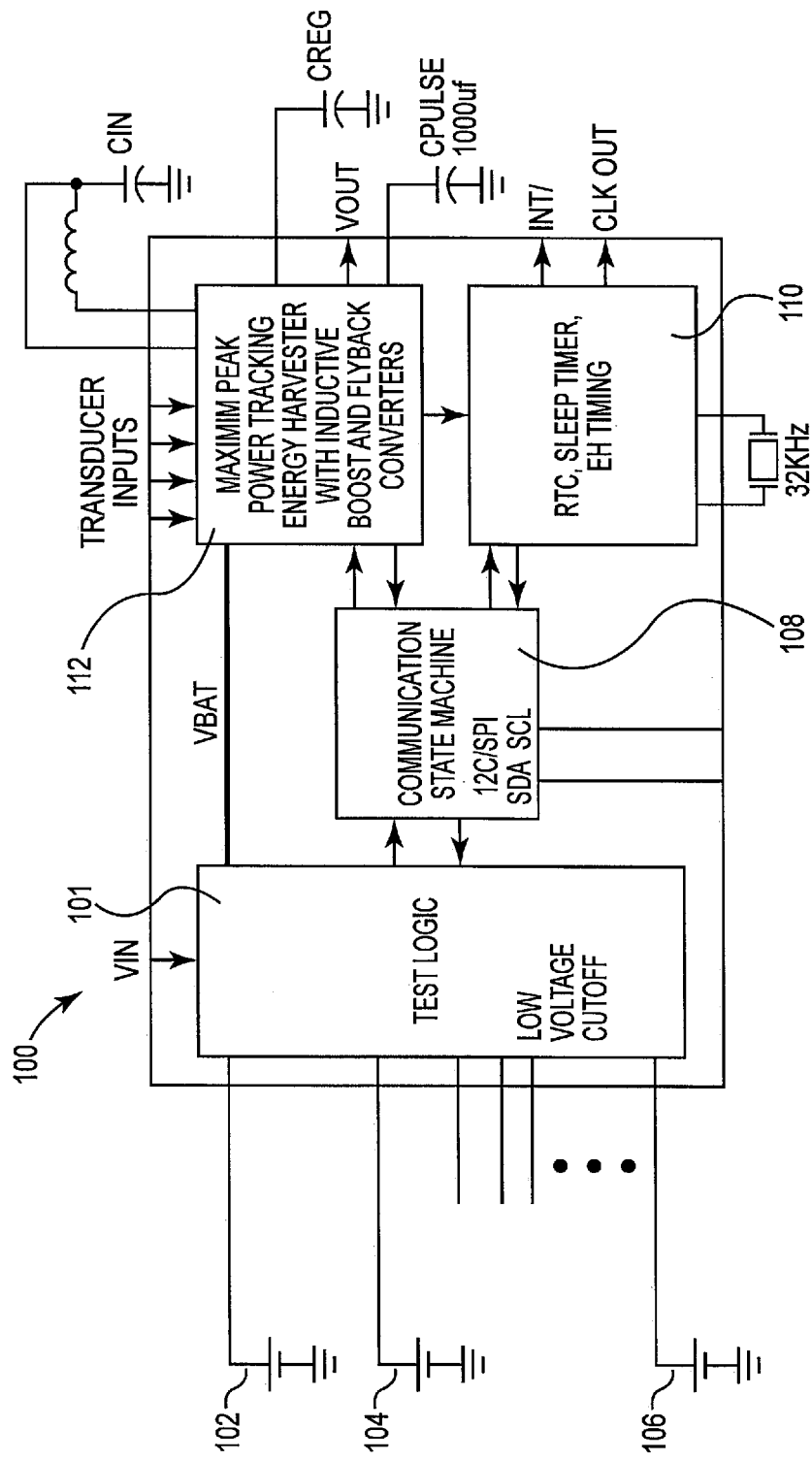
FIG. 6 is a circuit diagram showing an embodiment of the present invention.

The above described logic is preferably provided in an ASIC. A representative architecture of system including ASIC 100 is shown in FIG. 6. ASIC 100 is provided with testing logic component 101 that preferably conducts a periodic time voltage measurement of the separate microbattery cells 102, 104 and 106 to determine the health of each individual microbattery cell in the array. Aspects of component 101 are discussed in more detail below in the context of FIG. 9. In this embodiment, the testing logic to determine if a microbattery cell has a battery voltage that is more than a predetermined percentage different from the voltage of the overall microbattery cell array or has an absolute voltage below a predetermined cutoff threshold, and the logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold are located in component 101.

In a preferred embodiment, ASIC 100 provides system health reporting to external devices through Communication State Machine 108 via I2C and/or SPI bus.

Preferably, ASIC 100 comprises component 110 comprising functionalities such as a low power RTC, a sleep timer and/or energy harvesting power conversion circuits. Examples of such circuits include circuits suitable for converting power from one or more external power sources, such as solar cells, piezo-electric devices, thermal, vibrational, motion activated, radio-frequency induction or any other type of ambient power transducer. Such circuits may include power switches or converters, including boost or buck converters. Preferably ASIC 100 comprises component 112 providing Maximum Peak Power Tracking energy harvesting with "energy aware" reporting, i.e. measurement of input power available via I2C bus. Preferably, all options are settable via I2C/SPI bus. Power is supplied to component 110 via component 112. Optionally, the power supplied to component 112 may be converted by a Switch Capacitor DC-DC downconverter component (not shown, discussed in more detail below) that is located either within component 110 via component 112 or a separate component between the power source and component 110.

Figure 7:
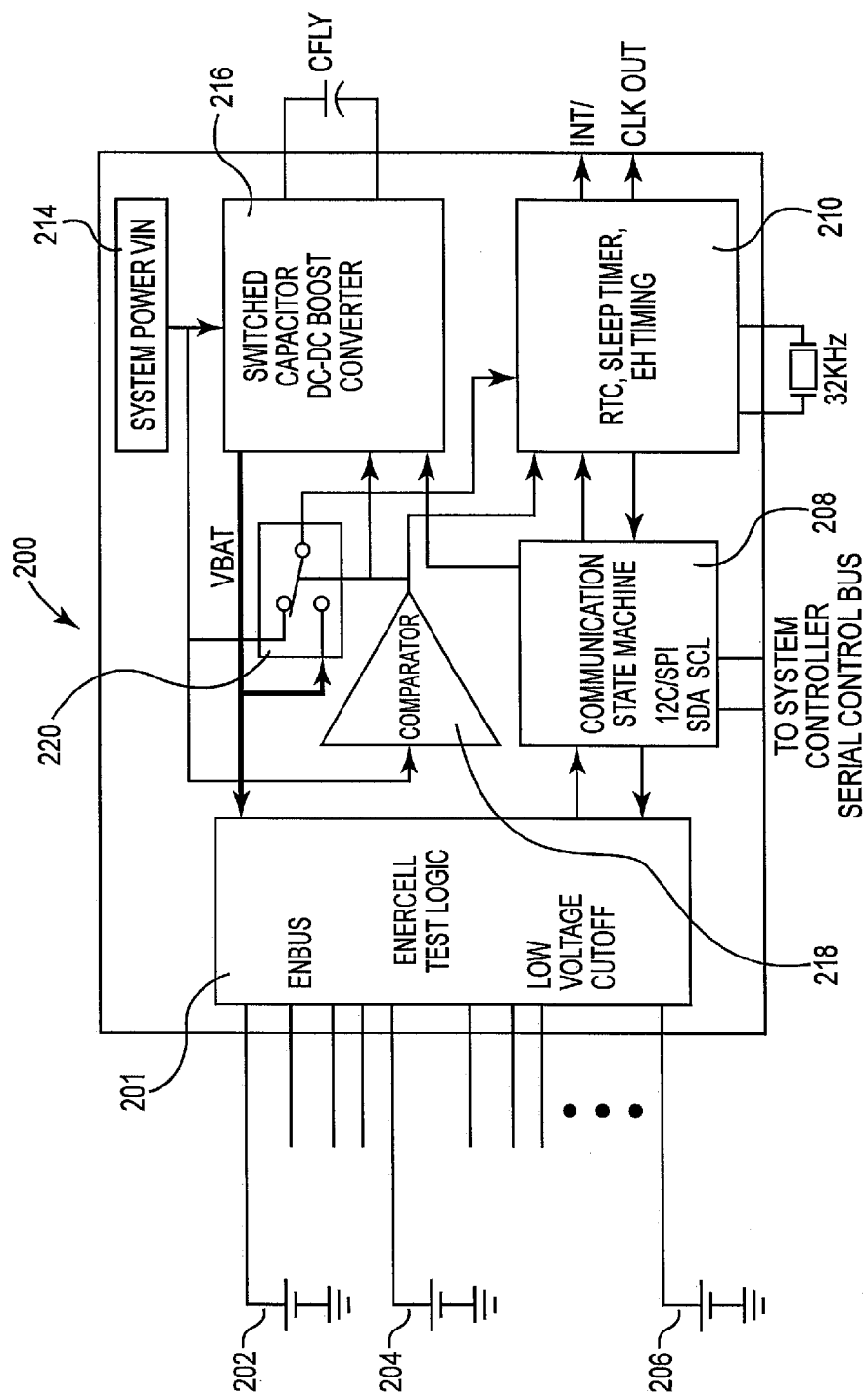
FIG. 7 is a circuit diagram showing another embodiment of the present invention.

Another embodiment is shown in FIG. 7, whereby ASIC 200 is provided with a testing logic component 201 that preferably conducts a periodic time voltage measurement of the separate microbattery cells 202, 204 and 206 determine the health of each individual microbattery cell in the array. Aspects of component 201 are discussed in more detail below in the context of FIG. 9. In this embodiment, the testing logic to determine if a microbattery cell has a microbattery cell voltage that is more than a predetermined percentage different from the voltage of the overall microbattery cell array or has an absolute voltage below a predetermined cutoff threshold, and the logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold are located in component 201.

In a preferred embodiment, ASIC 200 provides system health reporting to external devices through Communication State Machine 208 via I2C and/or SPI bus. The state of a given microbattery cell needing to be charged is communicated by Communication State Machine 208 to Switched Capacitor DC-DC boost converter 216, which applies voltage to charge the microbattery cell in need of charging. Preferably, the ASIC 200 comprises component 210 comprising functionalities such as a low power RTC, a sleep timer and for energy harvesting power conversion circuits. Examples of such circuits include circuits suitable for converting power from one or more external power sources, such as solar cells, piezoelectric devices, thermal, vibrational, motion activated, radio-frequency induction or any other type of ambient power transducer. Such circuits may include power switches or converters, including boost or buck converters. External power is supplied through system power VIN 214 to Switched Capacitor DC-DC boost converter 216, which provides power to charge a microbattery cell in need of charging as noted above, and additionally provides power to operate component 210 as needed. The availability of external power is determined by comparator 218, which identifies whether battery power is required to operate. ASIC functionalities provided by component 210. In the event that battery power is required, switch 220 is actuated to power component 210. Optionally, the power supplied to component 210 may be converted by a Switch Capacitor DC-DC downconverter component (not shown, discussed in more detail below) that is located either within component 210 or as a separate component between switch 220 and component 210.

Figure 8:
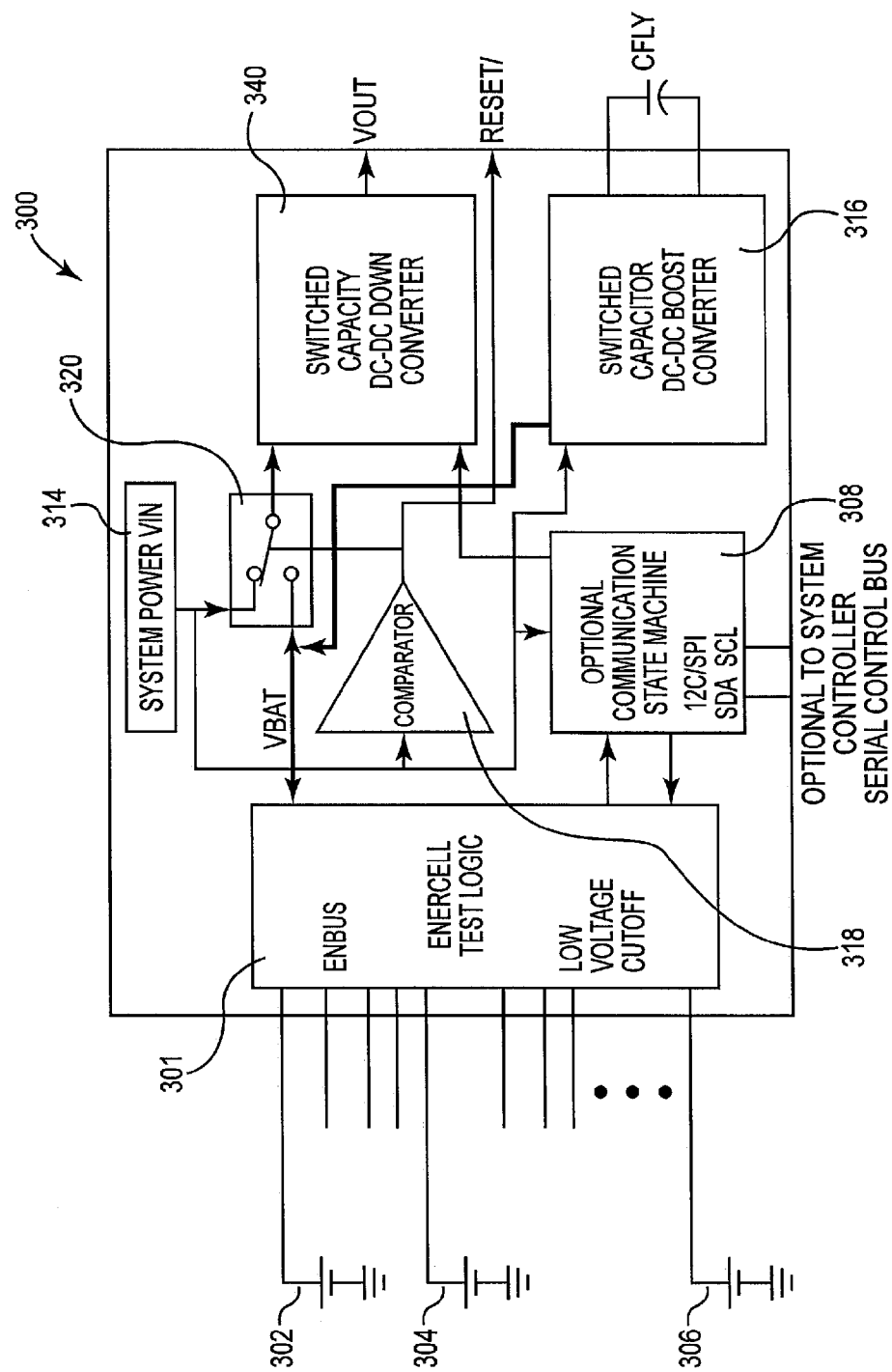
FIG. 8 is a circuit diagram showing another embodiment of the present invention.

Another embodiment is shown in FIG. 8, whereby ASIC 300 is provided with a testing logic component 301 that preferably conducts a periodic time voltage measurement of the separate microbattery cells 302, 304 and 306 determine the health of each individual microbattery cell in the array. Aspects of component 301 are discussed in more detail below in the context of FIG. 9. In this embodiment, the testing logic to determine if a microbattery cell has a microbattery cell voltage that is more than a predetermined percentage different from the voltage of the overall microbattery cell array or has an absolute voltage below a predetermined cutoff threshold, and the logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold are located in component 301.

In a preferred embodiment, ASIC 300 provides system health reporting to external devices through Communication State Machine 308 via I2C and/or SPI bus.

External power is supplied through system power VENT 314 to Switch Capacitor DC-DC downconverter component 340, which provides power to operate circuitry functionality on a different circuit (not shown). Downconverter 340 advantageously converts power provided from a higher voltage to lower voltage using capacitor switching elements rather than linear low dropout systems that reduce power through heat generating resistance components. Optionally, the level of power conversion by downcoverter 340 may be user selected by control via Communication State Machine 308.

External power is supplied through system power VIN 314 to Switched Capacitor DC-DC boost converter 316, which provides power to charge a microbattery cell in need of charging as noted above. The availability of external power is determined by comparator 318, which identifies whether battery power is required to operate ASIC functionalities described above. In the event that battery power is required, switch 320 is actuated to provide power to Downconverter 340.

Figure 9:
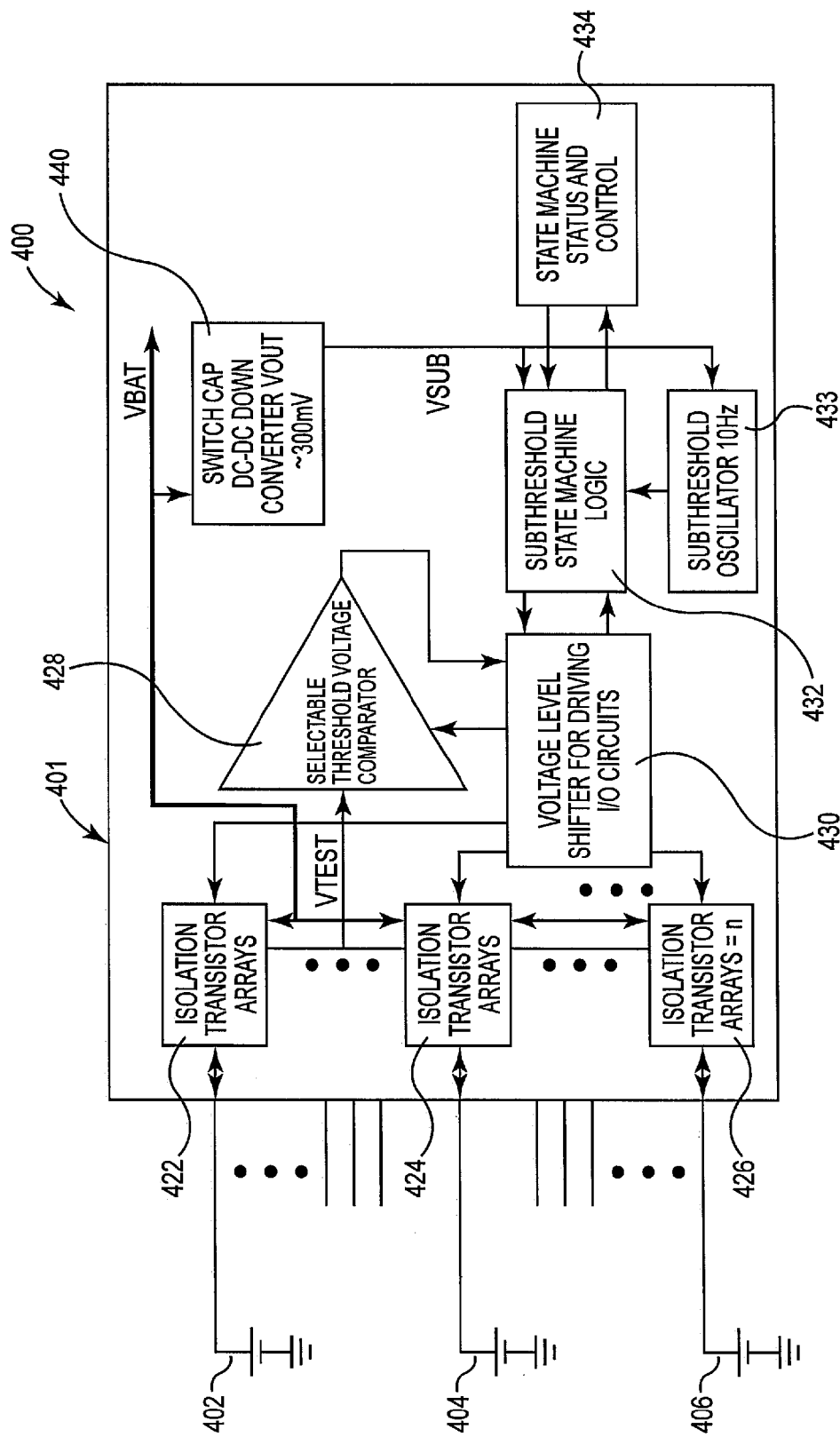
FIG. 9 is a circuit diagram showing an embodiment of the present invention, with particular focus on the elements of the test and switching functions of the system.

FIG. 9 is a diagram of a system of the present invention, with particular focus on the architecture of elements of the test and switching functions of the system, whereby ASIC 400 is provided with a testing logic component 401 that periodically disconnects each of the separate microbattery cells 402, 404 and 406 in the array by taking the microbattery cell offline and testing the voltage of the microbattery cell. Thus, testing logic component 401 conducts a periodic time voltage measurement to determine the health of each individual microbattery cell in the array. In an embodiment, the voltage of an individual microbattery cell is evaluated by Selectable Threshold Voltage Comparator 428. Comparison information is provided to Voltage Level Shifter 430 and evaluated using Subthreshold State Machine logic 432 to determine whether a microbattery cell is found to have a microbattery cell voltage that is more than a predetermined percentage different from the voltage of the overall microbattery cell array or has an absolute voltage below a predetermined cutoff threshold. Information is provided to Voltage Level Shifter 430 from Subthreshold State Machine logic 432, which drives I/O circuits that in turn operates to isolate such batteries from the system by a corresponding Isolation transistor array 422, 424 or 426. The isolation transistor array preferably comprises two gate switches, which function to maintain isolation of the microbattery cell selectively and to maintain zero leakage current. In an embodiment, the isolation transistor array comprises at least two series-connected transistors. Circuit configurations that operate to maintain zero leakage current are described in U.S. Pat. No. 8,228,023, which is incorporated herein by reference.

Additionally, Subthreshold State Machine logic 432 optionally provides information to outputs that report State Machine status and control 434, so that status of the microbattery cell array can be communication to external devices, such as monitoring computers and the like.

In a particularly unique aspect of the present invention, the ASIC 400 operates at subthreshold power levels using a Switch Capacitor DC-DC downconverter component 440. Thus, Subthreshold State Machine logic 432 is provided with subthreshold power (via Subthreshold Oscillator 433) from Downconverter 440. In an embodiment, the subthreshold oscillator 433 oscillates at 10 Hz.

Downconverter 440 advantageously converts power provided from a higher voltage to lower voltage using capacitor switching elements rather than linear low dropout systems that reduce power through heat generating resistance components. By use of a Switch capacitor system, energy is converted in a more efficient manner, all components may be integrated on the ASIC, and the overall system is more robust because sensitive electronic components are not exposed to heat generated by less efficient power conversion systems. Further, the ASIC comprising the Switch Capacitor DC-DC downconverter component is more reliable and is functional for a longer time (greater life expectancy) because of superior performance when operated at reduced voltage. Preferably, the ASIC is configured to operate at subthreshold voltages (i.e. below the threshold potential for operation of transistors). In a preferred embodiment, the Switch Capacitor DC-DC downconverter component reduces the voltage potential to from 10 to 1000 millivolts. In another preferred embodiment, the Switch Capacitor DC-DC downconverter component reduces the voltage potential to from 100 to 500 millivolts.

Operating the ASIC functionality at very low voltage increases reliability of the ASIC, because the circuit is operating at a voltage that imparts less physical challenge to the electronic components and leads to longer life. In a preferred embodiment, the ASIC comprises a voltage reducing component that comprises a DC-DC capacitor down converter, and does not comprise a linear regulator.

Various configurations of the above described embodiments will now be appreciated. For example, in preferred embodiments the system comprises a Switch Capacitor DC-DC downconverter component that reduces the voltage potential to operate all functionalities located on the single integrated circuit. In another embodiment, the Switch Capacitor DC-DC downconverter component reduces the voltage potential to operate microbattery cell testing and isolation functionalities located on the single integrated circuit.

All percentages and ratios used herein are weight percentages and ratios unless otherwise indicated. All patents, patent applications (including provisional applications), and publications cited herein are incorporated by reference as if individually incorporated for all purposes. Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

What is claimed is:

1. A rechargeable thin film microbattery cell array of at least two thin film microbattery cells electrically connected together, wherein the microbattery cells of the array are electrically connected in parallel to provide power as a single battery power source, the array further comprising testing logic to determine if a microbattery cell has a microbattery cell voltage that is more than a predetermined percentage different from the voltage of the overall microbattery cell array or has an absolute voltage below a predetermined cutoff threshold, and logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold, wherein the testing logic to determine if a microbattery cell has a microbattery cell voltage that is more than a predetermined percentage different from the voltage of the overall microbattery cell array or has an absolute voltage below a predetermined cutoff threshold, and the logic to disconnect any microbattery cell from the microbattery cell array if the microbattery cell has a microbattery cell voltage that is more than a predetermined percentage different from the voltage of the overall microbattery cell array or has an absolute voltage below a predetermined cutoff threshold is located on a single integrated circuit chip.

2. The array of claim 1, wherein the array is an array of from 4 to 64 microbattery cells.

3. The array of claim 1, wherein the array is an array of from 16 to 32 microbattery cells.

4. The array of claim 1, wherein the array is an array of from 50 to 256 microbattery cells.

5. The array of claim 1, wherein the array is an array of from 80 to 120 microbattery cells.

6. The array of claim 1, wherein the testing logic conducts a periodic time voltage measurement of the separate microbattery cells.

7. The array of claim 1, wherein the array of microbattery cells is fabricated on a single substrate.

8. The array of claim 7, wherein the array of microbattery cells comprises an anode current collector that is in common for all of the thin film microbattery cells.

9. The array of claim 1, wherein the array of microbattery cells is fabricated on a plurality of substrates that are then mounted on a single platform.

10. The array of claim 1, wherein the array provides an effective capacity of from about 0.05 mAH to about 1500 mAH.

11. The array of claim 1, wherein the array occupies a footprint area of no more than about 50 $cm^2$.

12. The array of claim 1, wherein the predetermined percentage is 2% at 25° C.

13. The array of claim 1, wherein single integrated circuit chip additionally comprises a Switch Capacitor DC-DC downconverter component.

14. The array of claim 13, wherein the Switch Capacitor DC-DC downconverter component reduces the voltage potential to from 10 to 1000 millivolts.

15. The array of claim 13, wherein the Switch Capacitor DC-DC downconverter component reduces the voltage potential to from 100 to 500 millivolts.

16. The array of claim 13, wherein the Switch Capacitor DC-DC downconverter component reduces the voltage potential to operate all functionalities located on the single integrated circuit.

17. The array of claim 13, wherein the Switch Capacitor DC-DC downconverter component reduces the voltage potential to operate microbattery cell testing and isolation functionalities located on the single integrated circuit.

18. The array of claim 1, wherein single integrated circuit chip does not comprise a linear regulator.

* * * * *